US007880083B2

(12) United States Patent
Livne

(10) Patent No.: US 7,880,083 B2
(45) Date of Patent: Feb. 1, 2011

(54) CONTAINER WITH MULTI-LEVEL SHIELDED COMPARTMENTS

(76) Inventor: Oren Livne, 712 N. San Marcos Rd., Santa Barbara, CA (US) 93111

( * ) Notice: Subject to any disclaimer, the term of this patent is extended or adjusted under 35 U.S.C. 154(b) by 1024 days.

(21) Appl. No.: 11/627,986

(22) Filed: Jan. 29, 2007

(65) Prior Publication Data

US 2007/0142103 A1    Jun. 21, 2007

Related U.S. Application Data

(63) Continuation-in-part of application No. 11/311,769, filed on Dec. 20, 2005, now abandoned.

(51) Int. Cl.
*H05K 5/00* (2006.01)
*B65D 85/00* (2006.01)

(52) U.S. Cl. .................. 174/50; 174/350; 174/377; 174/387; 340/572.8; 340/572.1; 361/816; 455/575.1; 206/719; 206/720

(58) Field of Classification Search ............. 174/50, 174/350, 377, 387, 388, 356, 378, 386, 393, 174/391, 379, 363; 340/527.1, 572.7, 572.8, 340/539.1, 825.69, 10.1, 10.3, 572, 10.31; 235/375, 380, 383, 487, 492; 343/702, 841; 455/128, 575.5, 575.1; D14/250; 206/719, 206/720; 361/818, 816, 679.01, 600
See application file for complete search history.

(56) References Cited

U.S. PATENT DOCUMENTS 5,136,119 A * 8/1992 Leyland .................. 174/379

5,401,901 A * 3/1995 Gerry et al. .................. 174/391
5,534,663 A * 7/1996 Rivers et al. ................. 174/363

(Continued)

OTHER PUBLICATIONS

"Mobile Edge Insulates Bluetooth Phones From Hackers", Dec. 12, 2005, http://www.wirelessdevnet.com/news/2005/dec/15/news5.html.

(Continued)

*Primary Examiner*—Angel R Estrada
(74) *Attorney, Agent, or Firm*—Oren Livne

(57) ABSTRACT

The present invention discloses a container or bag with several types of compartments with different forms of electromagnetic/wireless shielding. The types of compartments include a) an electromagnetic/wireless shielded compartment useful for line-of-site type shielding, b) an electromagnetic/wireless shielded compartment useful when a complete shielding enclosure is needed, and c) an unshielded compartment. The line-of-site shielded compartment prevents wireless access to the contents contained within when a complete shielding enclosure is not required, for example, for objects containing RFID tags, such as passports, books, and clothing. The compartment with a complete shielding enclosure prevents wireless access to devices that require a complete Faraday type cage, such as mobile phones, PDAs, or computers. Placing these and other devices within the shielded compartments protects them from remote access, and the data within is shielded from unscrupulous individuals. Objects placed within the unshielded compartment, such as workplace entrance badges, can continue to be accessed wirelessly. In this way, the user of the bag may select which objects to shield (and how to shield them) and which not to shield, so for example, one can use a workplace badge to enter without credit card data being skimmed. This may be done with the comfort and ease of a single bag or container.

20 Claims, 5 Drawing Sheets

U.S. PATENT DOCUMENTS

| | | | |
|---|---|---|---|
| 5,545,844 A * | 8/1996 | Plummer et al. | 174/379 |
| 7,075,798 B2 * | 7/2006 | Hendrickson | 361/818 |
| 7,336,186 B2 * | 2/2008 | Noguchi | 340/572.8 |
| 7,598,875 B2 * | 10/2009 | Noguchi | 340/572.8 |
| 7,601,921 B2 * | 10/2009 | Schroader | 340/572.8 |
| 2005/0092504 A1 | 5/2005 | Walthall | |
| 2006/0187061 A1 | 8/2006 | Colby | |

OTHER PUBLICATIONS

Lisa Katayama, "Japanese schoolgirl watch," Wired Magazine, Issue 13.11, Nov. 2005, http://www.wired.com.

* cited by examiner

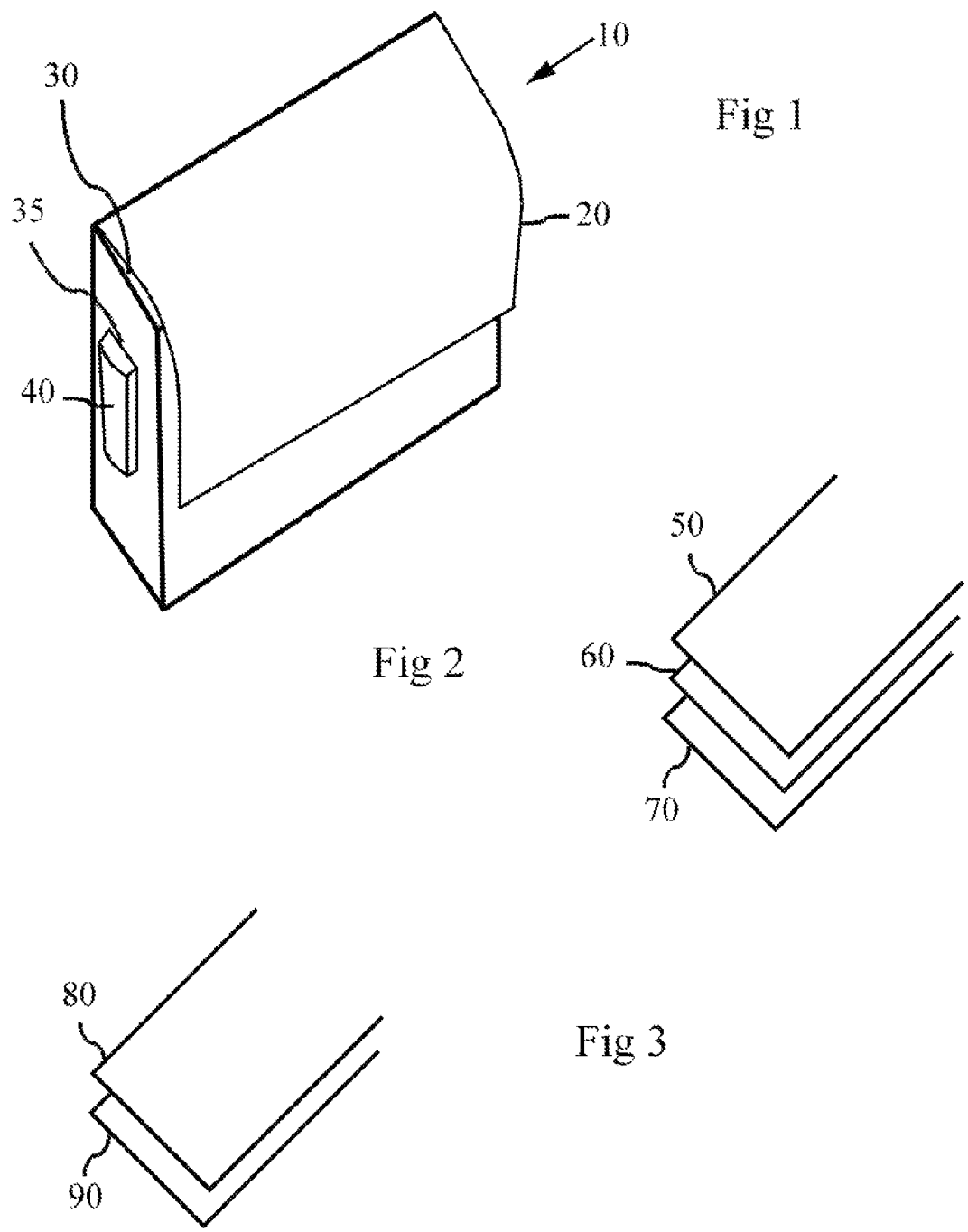

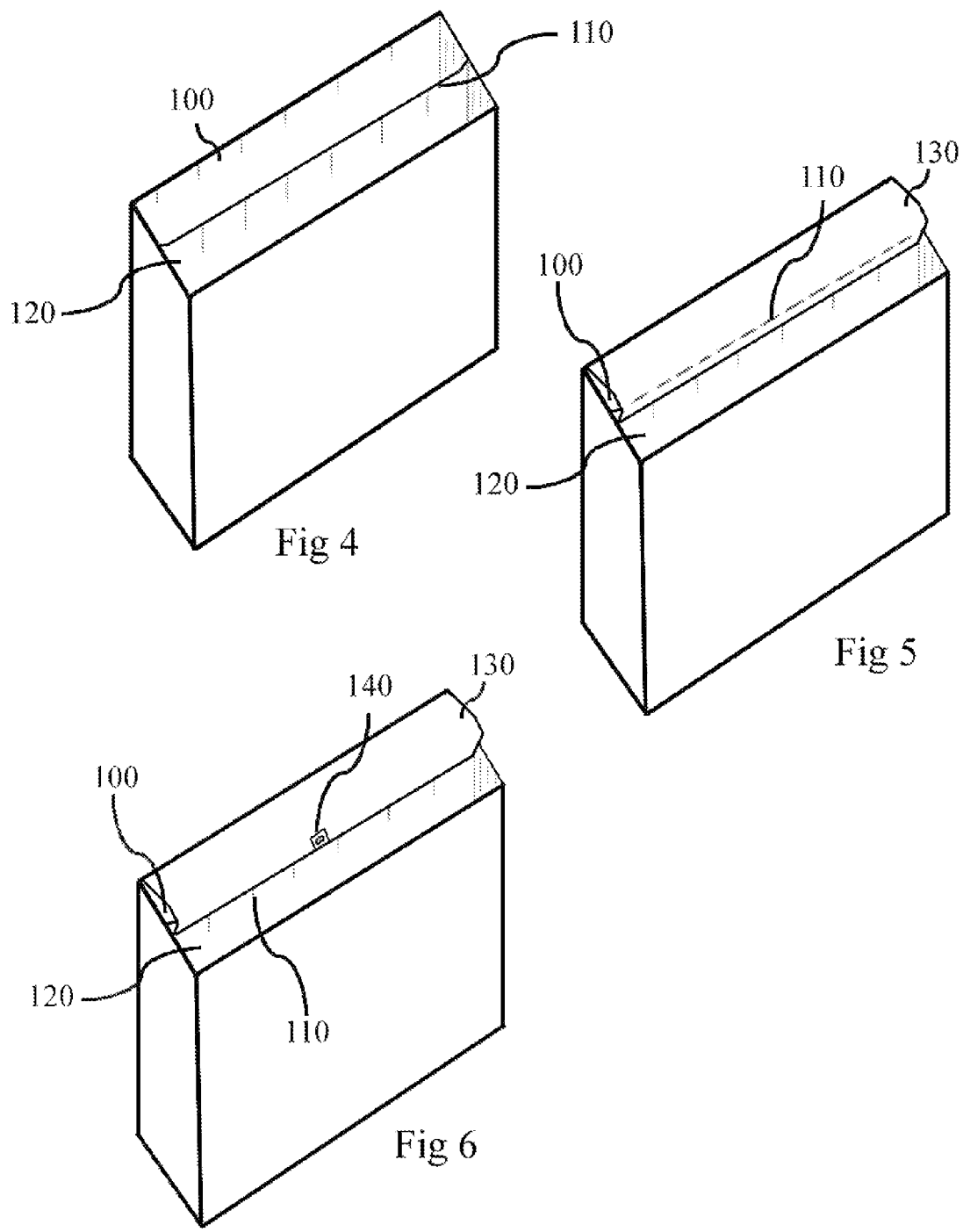

CONTAINER WITH MULTI-LEVEL SHIELDED COMPARTMENTS

CROSS REFERENCE TO RELATED APPLICATIONS

This patent application is a continuation in part under 35 U.S.C 120 to U.S. utility application Ser. No. 11/311,769 filed on Dec. 20, 2005 by Livne et al, entitled "Container with both Shielded and Unshielded Compartments", which is incorporated by reference herein.

BACKGROUND OF THE INVENTION

1. Field of Invention

This invention relates to containers providing electromagnetic shielding.

2. Description of Related Art

The use of devices to track products and information remotely, such as RFID (radio frequency identification) tags, has become more and more prevelant. RFID tags are currently in use or have been proposed for use in objects ranging from library books, to passports, to credit cards, to articles of clothing. RFID and other tags that can be read from a distance provide significant benefits in tracking objects and have the potential to greatly enhance the efficiency of various industrial operations. This benefit comes at a potential cost to the consumer—a loss of privacy.

Since object information can be tracked remotely, it is possible for unscrupulous parties to gain access to data concerning an individual's purchases, finances, or other private information without direct contact with that individual. This eavesdropping or skimming of information can be minimized with encription of the data provided by the RFID or other tags and through handshake protocols that require identification of a reader before access to data is granted. It is, however, exceedingly difficult to prevent eavesdropping and skimming from sophisticated parties through these methods.

One solution is to minimize the time during which a tag may be accessed by shielding that tag in a container that does not allow transmission (or significantly reduces transmission) of electromagnetic waves. Such shielding also provides benefits for computers, personal digital assistants (PDAs), and other devices that may be accessed remotely and which contain potentially private or confidential information. US Patent Application Publication No. 20050092504 "Personal electromagnetic security unit and method for electromagnetically shielding portable electronic communication and data devices and the like" discloses a personal electromagnetic shielding unit that shields devices from unwanted wireless access, and is incorporated by reference herein.

Such shielding units, while useful in certain circumstances, provide significant difficulties to potential users. A user may wish to allow certain devices to be accessed remotely, such as a mobile phone for receiving incoming calls, while other devices such as a computer or RFID containing book, are shielded from remote access. However, if all devices are placed in the shielding unit, wireless access to all will be prevented.

Different types of wireless devices may operate differently and may therefore require shielding of different types. For example, an RFID containing card may be shielded from a reader by placing a piece of aluminum foil between the reader and card while a cell phone may need to be completely surrounded by a conductive fabric to be effectively shielded. A unique container or bag design is therefore needed to effectively shield different types of wireless devices.

BRIEF SUMMARY OF THE INVENTION

The present invention overcomes disadvantages in the related art and discloses a container or bag with several types of compartments with different forms of electromagnetic/wireless shielding. The types of compartments include two or more of a) an electromagnetic/wireless shielded compartment useful for line-of-site type shielding, b) an electromagnetic/wireless shielded compartment useful when a complete shielding enclosure is needed, and c) an unshielded compartment.

The line-of-site shielded compartment prevents wireless access to the contents contained within when a complete shielding enclosure is not required, for example, for objects containing RFID tags, such as passports, books, and clothing. The compartment with a complete shielding enclosure prevents wireless access to devices that require a complete Faraday type cage, such as mobile phones, PDAs, or computers. Placing these and other devices within the shielded compartments protects them from remote access, and the data within is shielded from unscrupulous individuals. Objects placed within the unshielded compartment, such as workplace entrance badges, can continue to be accessed wirelessly. In this way, the user of the bag may select which objects to shield (and how to shield them) and which not to shield, so for example, one can use a workplace badge to enter without credit card data being skimmed. This may be done with the comfort and ease of a single bag or container.

A bag or container with both line-of-site and complete enclosure shielding provides design flexibility while still enabling privacy protection. A complete shielding enclosure inherently has constraints that line-of-site shielding does not, a fact that may be taken advantage of to implement unique bag or container designs.

BRIEF DESCRIPTION OF DRAWINGS

FIG. 1 depicts a bag with an internal shielded compartment and an external unshielded compartment.

FIG. 2 depicts the layers of fabric used for the shielded compartment of FIG. 1.

FIG. 3 depicts the layers of fabric used for the unshielded compartment of FIG. 1.

FIG. 4 depicts a bag with a shielded compartment adjacent to an unshielded compartment.

FIG. 5 depicts the bag of FIG. 4 with an internal shielded flap.

FIG. 6 depicts the bag of FIG. 5 with a securing snap.

DETAILED DESCRIPTION OF THE INVENTION

Figure 7:
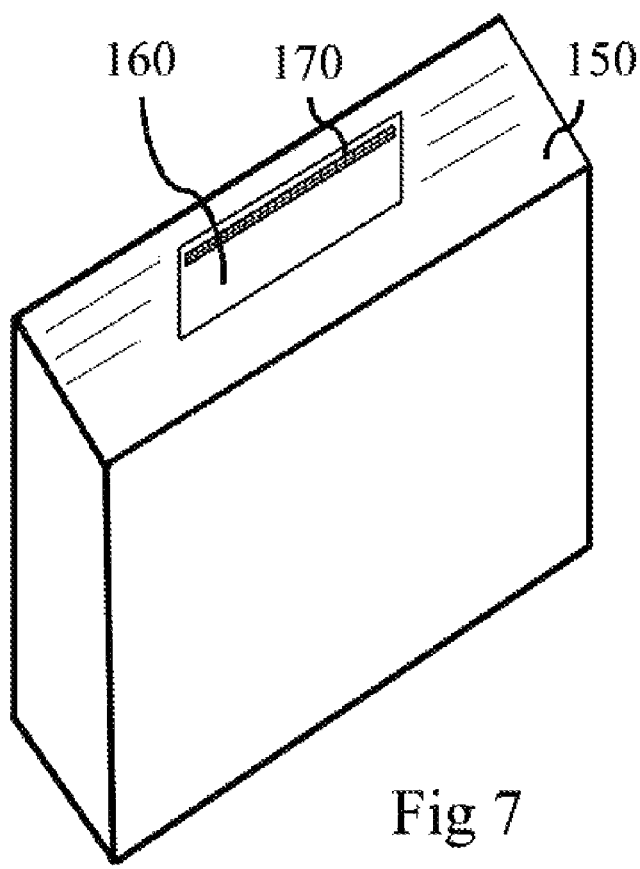
FIG. 7 depicts a bag with an internal shielded pocket.

FIG. 1 illustrates a bag 10 with a shielded compartment 30 onto which an unshielded compartment 40 is attached. The shielded interior is covered by a flap 20. The shielding effect is provided by a fabric (such as silver coated nylon) that significantly reduces transmission of electromagnetic waves into or out of the compartment 30.

FIG. 2 illustrates the layers of shielding fabric used to produce the shielded compartment 30 of FIG. 1. The shielding fabric 60 is sandwiched between exterior 50 and interior 70 layers of fabric (alternatively, the shielded compartment can be composed of a single or double layer of fabric—the shielding fabric can be used alone or in conjunction with one other layer of fabric).

FIG. 3 illustrates the layers of fabric used to produce the unshielded compartment 40 of FIG. 1. The unshielded compartment is composed of standard fabrics and can be two-ply with an exterior 80 and interior 90 as illustrated in FIG. 3 or single ply. It should be noted that the unshielded compartment does have a single wall 35 which contains shielding—the shielding is contained in the wall of the shielded compartment onto which the unshielded compartment is connected. All other sides of the unshielded compartment are unshielded two-ply as illustrated in FIG. 3 or single ply.

Now that the concept has been disclosed, the bag 10 of FIG. 1 as well as the bags described below can be manufactured by those of ordinary skill in the art of bag making. As noted in US Patent Application Publication No. 20050092504, the bag closing mechanism can be enhanced to create a complete electromagnetic seal.

The bag 10 of FIG. 1 can be used to hold two different types of objects. Objects for which privacy or security is desired (private objects), including those containing RFID tags, such as passports, books, and clothing, and other devices such as computers and PDAs may be placed within the shielded compartment 30 so they are shielded from remote access, and the data within is protected from unscrupulous individuals. Objects placed within the unshielded compartment 40, such as mobile phones and workplace entrance badges, can continue to be accessed wirelessly (non-private objects). In this way, the user of the bag may select which objects to shield and which not to shield, so for example, an important call can be received without passport data being skimmed. This may be done with the comfort and ease of a single bag. The user of the bag may also select when to allow a device to be accessed and when to prevent access—for example, placing a mobile phone in the shielded compartment to prevent access (such as remote tracking) until a time when a call is expected, when the phone is moved to the unshielded compartment.

FIG. 4 illustrates an alternative design where a shielded compartment 100 and unshielded compartment 120 are adjacent to each other and separated by a divider 110. In order for the shielded compartment 100 to be completely enclosed with shielding material, the divider 110 must also contain shielding material. FIG. 5 illustrates an additional internal flap 130 which ensures that objects placed in the shielded compartment 100 are entirely surrounded by shielding material. FIG. 6 illustrates the bag of FIG. 5 with a snap for closing the bag so objects in the unshielded compartment 120 will not fall out.

Figure 8:
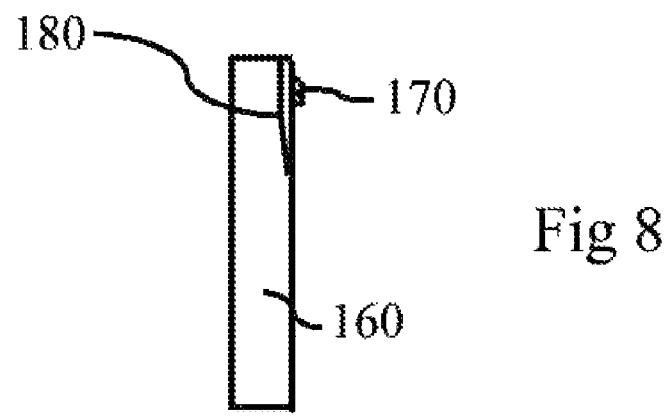
FIG. 8 depicts the internal shielded pocket of FIG. 7 in greater detail.

FIG. 7 illustrates another alternative design where a shielded compartment 160 is an internal pocket within an unshielded compartment 150. The shielded compartment 160 has a zipper 170 used to close the shielded pocket 160. FIG. 8 illustrates the internal pocket 160 in additional detail. A shielding flap 180 lies behind the zipper 170 to ensure a continuous shielding compartment. An object is placed in the shielded compartment 160 by opening the zipper 170. The object is inserted and passes by the shielding flap 180, which is only connected at its top. The object falls into the shielded compartment 160 and the shielded flap drops back into place.

Different types of wireless devices may operate in different ways and may utilize signals of different frequencies. RFID tags, for example, often operate in the kHz range while phones may operate in the GHz range. The different types of wireless devices may therefore require shielding of different types. An RFID containing card may be shielded from a reader by placing a piece of aluminum foil between the reader and card while a cell phone may need to be completely surrounded by a conductive fabric to be effectively shielded. A unique container or bag design is therefore needed to effectively shield different types of wireless devices.

Figure 9:
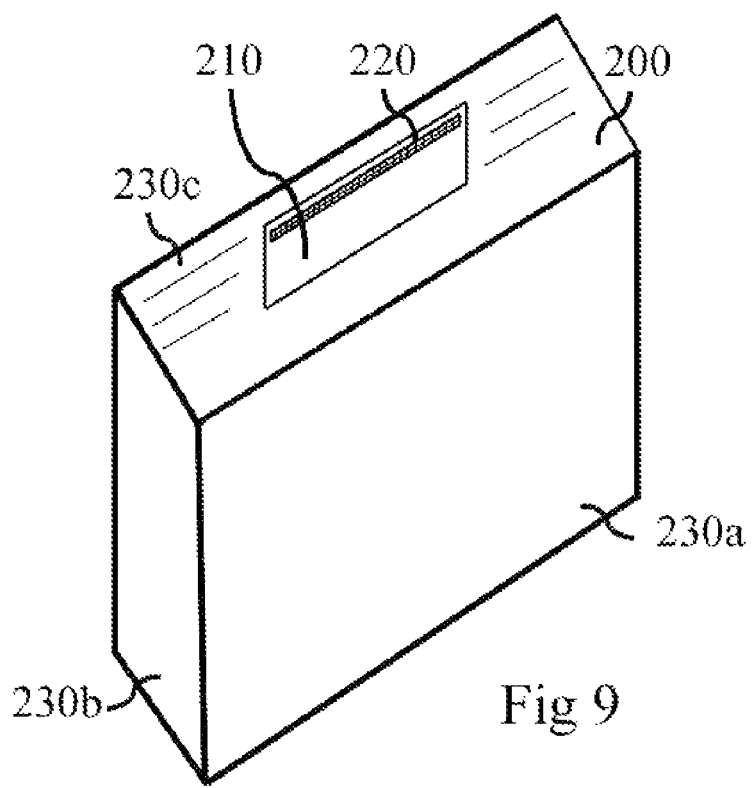
FIG. 9 depicts a bag with a complete enclosure shielded compartment within a line-of-site shielded compartment.

FIG. 9 depicts such a bag with a complete enclosure shielded compartment 210 within a line-of-site shielded compartment 200. The complete enclosure shielded compartment 210 can be used to protect devices such as PDAs (Personal Digital Assistants) or cell phones from unauthorized individuals. A zipper 220 is used to close the compartment as described earlier. Alternatively, a Velcro or hook and loop fastener may be used. The complete enclosure shielded compartment 210 must include a layer of shielding material, such as conductive copper or other metal fabric, in a manner that when the compartment is closed, the device placed inside is surrounded by a continuous layer of shielding material.

The complete enclosure shielded compartment 210 resides within a line-of-site shielded compartment 200. The line-of-site shielded compartment 200 does not require a continuous enclosure of shielding material. The walls of the bag 230 a, b, c (and d, not shown) and, optionally, the bottom of the bag contain a shielding material, such as aluminum, which blocks signals of devices such as RFID tags. These operate in a manner different than cell phones and do not require a complete enclosure.

The present invention provides both a complete enclosure shielded compartment and a line-of-site shielded compartment while still allowing easy access to the bag's contents. The line-of-site shielded compartment can have a conventional opening and does not need a special closing mechanism, such as is generally required for a complete shielding enclosure. In this way, the entire bag offers some level of shielding while critical devices requiring a complete enclosure may still be protected.

Figure 10:
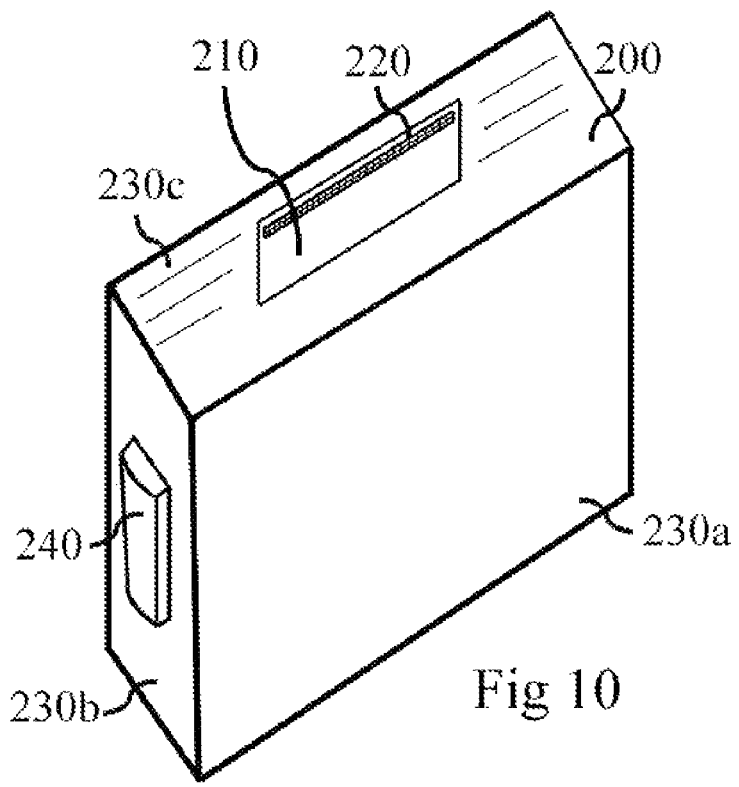
FIG. 10 depicts the bag of FIG. 9 with an unshielded compartment external to the two shielded compartments

FIG. 10 depicts the bag of FIG. 9 with an unshielded compartment 240 external to the two shielded compartments 200, 210. This provides additional options for the bag's user. Devices for which transmission is desired, such as work entry badges, can be placed in the unshielded compartment 240. Objects containing RFID tags, for which privacy is desired, such as library books, passports, and credit cards may be placed in the line-of-site shielded compartment 200. Devices requiring a complete shielding enclosure, such as a PDA, can be placed in the complete enclosure compartment 210. In this manner, the bag of FIG. 10 provides the user with several different levels of shielding security.

Figure 11:
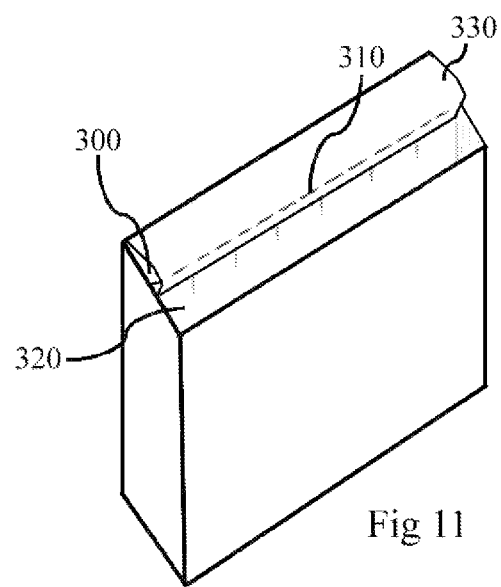
FIG. 11 depicts a bag with a complete enclosure shielded compartment adjacent to a line-of-site shielded compartment.

FIG. 11 illustrates an alternative design where a complete enclosure shielded compartment 300 and line of site shielded compartment 320 are adjacent to each other and separated by a divider 310. In order for the complete enclosure shielded compartment 300 to be completely enclosed with shielding material, the divider 310 must also contain shielding material. A flap 330 ensures that objects placed in the complete enclosure shielded compartment 300 are entirely surrounded by shielding material.

Figure 12:
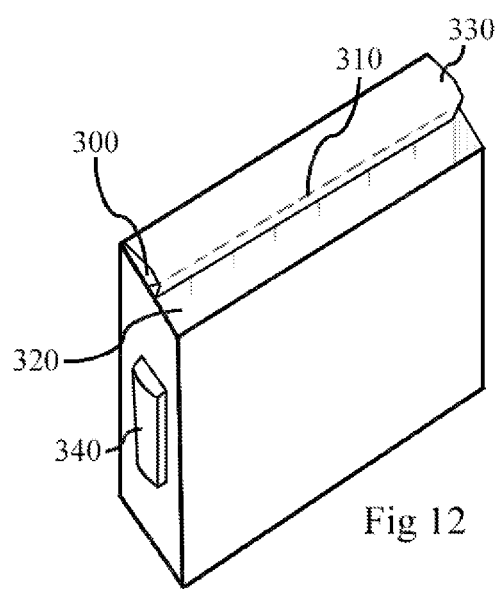
FIG. 12 depicts the bag of FIG. 11 with an unshielded compartment external to the two shielded compartments

FIG. 12 depicts the bag of FIG. 11 with an unshielded compartment 340 external to the two shielded compartments 300, 320. This provides additional options for the bag's user. Devices for which transmission is desired, such as work entry badges, can be placed in the unshielded compartment 340.

Objects containing RFID tags, for which privacy is desired, such as library books, passports, and credit cards may be placed in the line-of-site shielded compartment 300. Devices requiring a complete shielding enclosure, such as a PDA, can be placed in the complete enclosure compartment 320. In this manner, the bag of FIG. 12 provides the user with several different levels of shielding security.

CONCLUSION

The various bags or containers described above are given as examples only and should not be construed as limitations to the invention. Many variations based on the basic inventive concepts are possible. Alternative combinations of shielded and unshielded compartments could be used, including but not limited to multiple shielded compartments attached to a single unshielded compartment, multiple unshielded compartments attached to a single shielded compartment, or multiple unshielded compartments attached to multiple shielded compartments.

The word bag used above should be broadly construed to cover any container, whether rigid or flexible. The bag designs described above could work equally well as a briefcase, for example, with a shielded compartment and an unshielded compartment. Any type of fabric or other material may be used to form the container so long as a shielding effect is generated in the shielded compartment and the unshielded compartment allows transfer of wireless information from inside to outside or vice versa. The orientation of the compartments may be modified in various ways, including, but not limited to, those described above.

The use of the words shielded, shielding or the phrases electromagnetically shielded, or shielding effect should be construed as preventing (or significantly reducing) transmission or receipt of wireless data or information at one or more frequencies or frequency ranges of the electromagnetic spectrum. The shielding effect does not need to be functional at all frequency ranges. For example, x-rays could permeate a shielded compartment while RFID tags are inaccessible.

The words wireless information or data are intended to be broadly construed to describe any information which can be accessed without the use of a direct physical connection, generally through the use of electromagnetic waves, such as those used in RFID tags, WiFi or other wireless computing protocols, mobile telephones, cordless telephones, etc.

I claim:

1. A portable bag comprising a line-of-site shielded compartment, a complete enclosure shielded compartment, and an unshielded compartment, wherein:
   a) a first object capable of wireless transmission placed within the line-of-site shielded compartment is unable to communicate with devices external to said line-of site shielded compartment;
   b) a second object capable of wireless transmission placed within the complete enclosure shielded compartment is unable to communicate with devices external to said complete enclosure shielded compartment;
   c) a third object capable of wireless transmission placed within the unshielded compartment is able to communicate with devices external to said unshielded compartment;
   d) the first object is a private object containing private information whose access to third parties is not desired and which is unable to transmit through the line-of-site shielded compartment;
   e) the second object is a private object containing private information whose access to third parties is not desired and which is unable to transmit through the complete enclosure shielded compartment; and
   f) the third object is a non-private object for which external communication is desired.

2. A portable bag comprising a line-of-site shielded compartment, a complete enclosure shielded compartment, and an unshielded compartment, wherein a first object capable of wireless transmission placed within the line-of-site shielded compartment is unable to communicate with devices external to said line-of site shielded compartment, a second object capable of wireless transmission placed within the complete enclosure shielded compartment is unable to communicate with devices external to said complete enclosure shielded compartment, and a third object capable of wireless transmission placed within the unshielded compartment is able to communicate with devices external to said unshielded compartment.

3. The portable bag of claim 2 where the first object is selected from a group composed of a an RFID tag, a library book, a passport, a credit card, and a product.

4. The portable bag of claim 2 where the second object is selected from a group composed of a PDA and a product.

5. The portable bag of claim 2 where the third object is selected from the group composed of a mobile phone, and an entrance ID badge.

6. The portable bag of claim 2 where the unshielded compartment is an external pocket affixed to the line-of-site shielded compartment.

7. The portable bag of claim 2 where the unshielded compartment and the line-of-site shielded compartment share a common dividing wall.

8. The portable bag of claim 2 where the complete enclosure shielded compartment is a pocket internal to the line-of-site shielded compartment.

9. A portable bag comprising a line-of-site shielded compartment and a complete enclosure shielded compartment, wherein a first object capable of wireless transmission placed within the line-of-site shielded compartment is unable to communicate with devices external to said line-of site shielded compartment, and a second object capable of wireless transmission placed within the complete enclosure shielded compartment is unable to communicate with devices external to said complete enclosure shielded compartment.

10. The portable bag of claim 9 where the first object is selected from a group composed of a an RFID tag, a library book, a passport, a credit card, and a product.

11. The portable bag of claim 9 where the second object is selected from a group composed of a PDA, a mobile phone, and a product.

12. The portable bag of claim 9 where the complete enclosure shielded compartment is a pocket internal to the line-of-site shielded compartment.

13. The portable bag of claim 9 where the complete enclosure shielded compartment and the line-of-site shielded compartment share a common dividing wall.

14. The portable bag of claim 9 further comprising an unshielded compartment, wherein a third object capable of wireless transmission placed within the unshielded compartment is able to communicate with devices external to said unshielded compartment.

15. The portable bag of claim 12 further comprising an unshielded compartment, wherein a third object capable of wireless transmission placed within the unshielded compartment is able to communicate with devices external to said unshielded compartment.

16. The portable bag of claim 13 further comprising an unshielded compartment, wherein a third object capable of wireless transmission placed within the unshielded compartment is able to communicate with devices external to said unshielded compartment.

17. The portable bag of claim 14 where the unshielded compartment is an external pocket affixed to the line-of-site shielded compartment.

18. The portable bag of claim 14 where the unshielded compartment and the line-of-site shielded compartment share a common dividing wall.

19. The portable bag of claim 15 where the unshielded compartment is an external pocket affixed to the line-of-site shielded compartment.

20. The portable bag of claim 15 where the unshielded compartment and the line-of-site shielded compartment share a common dividing wall.

* * * * *